(12) United States Patent
Hara et al.

(10) Patent No.: US 6,451,696 B1
(45) Date of Patent: Sep. 17, 2002

(54) METHOD FOR RECLAIMING WAFER SUBSTRATE AND POLISHING SOLUTION COMPOSITIONS THEREFOR

(75) Inventors: Yoshihiro Hara; Tetsuo Suzuki, both of Kobe (JP); Satoru Takada; Hidetoshi Inoue, both of Hayward, CA (US)

(73) Assignees: Kabushiki Kaisha Kobe Seiko Sho, Kobe (JP); Kobe Precision Inc., Hayward, CA (US)

( * ) Notice: Subject to any disclaimer, the term of this patent is extended or adjusted under 35 U.S.C. 154(b) by 0 days.

(21) Appl. No.: 09/384,725

(22) Filed: Aug. 27, 1999

(30) Foreign Application Priority Data

Aug. 28, 1998 (JP) .......................................... 10-243868

(51) Int. Cl.[7] ............................................. H01L 21/302
(52) U.S. Cl. ........................ 438/691; 438/692; 438/693; 438/745
(58) Field of Search ................................ 438/691, 692, 438/693, 745, 747, 754, 756, 757

(56) References Cited

U.S. PATENT DOCUMENTS

| 3,715,842 A | * | 2/1973 | Tredinnick et al. ........... 451/36 |
| 3,923,567 A | * | 12/1975 | Lawrence ...................... 438/4 |
| 5,622,875 A | | 4/1997 | Lawrence .................... 438/691 |
| 5,855,735 A | * | 1/1999 | Takada et al. ............... 438/691 |

* cited by examiner

*Primary Examiner*—Benjamin L. Utech
*Assistant Examiner*—Binh X Tran
(74) *Attorney, Agent, or Firm*—Oblon, Spivak, McClelland, Maier & Neustadt, P.C.

(57) ABSTRACT

A method for reclaiming a wafer substrate material having a metallic film and a dielectric film includes a step for removing the entire metallic film and a part of the dielectric film with a chemical etching agent so as not to substantially dissolve the wafer substrate material itself, a step for removing the residual dielectric layer and the degenerated zone beneath the surface of the substrate by chemical-mechanical polishing, and a step for polishing at least one surface of the substrate.

15 Claims, 1 Drawing Sheet

METHOD FOR RECLAIMING WAFER SUBSTRATE AND POLISHING SOLUTION COMPOSITIONS THEREFOR

CROSS REFERENCE TO RELATED APPLICATION

The entire disclosure of Japanese Patent Application No. 10-243868, filed on Aug. 28, 1998, priority of which is claimed under 35 USC 119, including specification, claims, drawings, and summary are incorporated herein by reference in its entirety.

FIELD OF THE INVENTION

The present invention relates to methods for reclaiming wafer substrates, more particularly to a method for reclaiming a used semiconductor wafer substrate so that the substrate is of a quality which is substantially comparable to a prime grade wafer used in the production of semiconductor devices.

BACKGROUND

In the production of semiconductor devices, two grades of single crystal silicon wafers, e.g., a prime grade and a test grade, are used. The prime grade wafers are used for producing actual semiconductor devices, and the test grade wafers are used to determine whether or not the production process is sufficiently satisfactory. The quality standard for the prime grade is more stringent than that for the test grade. Semiconductor manufacturers use test grade wafers having the quality comparable to that of prime grade wafers by preference. Such test grade wafers are expensive compared to general test grade wafers. A typical used semiconductor wafer has a doped and/or diffused zone beneath the original front surface, and conductive and dielectric layers, which are formed on the doped or diffused zone.

In reclamation of a wafer substrate, both the surface layers and the doped or diffused zone beneath the wafer surface are removed. Used wafers delivered to reclamation plants are made of various materials and have a variety of surface structures and subjacent layers. For example, some wafers used for measurement of film thickness have several surface layers, and some wafers rejected in the production process have their own film structures, combinations of film materials, and doped elements.

A variety of conventional methods for reclaiming used semiconductor wafers are in use. Since these methods remove large amount of material from the surface as compared to the thickness of surface layers and diffused or doped zones, a wafer can be recycled only once or twice.

The most frequently used conventional method is a chemical etching process. For example, U.S. Pat. No. 3,923,567 discloses a process for dipping a wafer substrate having a surface layer into an etching bath containing sulfuric acid to remove organic substances, hydrochloric acid and nitric acid to remove metallic substances, and hydrofluoric acid to remove oxides and nitrides. According to this patent, a preferable etching rate is 12 $\mu$m/sec. A mixture of nitric acid ($HNO_3$) and hydrofluoric acid (HF) is frequently used as an etching solution for reclamation, since the mixture can remove most films and doped or diffused zones.

Wafers can also be reclaimed by a lapping process. The lapping process can remove various materials on the wafer regardless of the surface structure and pattern and the constituents on the wafer, unlike the chemical etching process. In the lapping process, a wafer is pressed against a rotating metal plate, while a lapping solution is supplied between the wafer surface and the plate (the lap). In double-side lapping, a wafer is pressed between a pair of metal plates (generally, cast-iron plates), which rotate in the opposite directions. The abrasive grains collide with the wafer surface to generate small cracks beneath the wafer surface and to remove the surface materials.

U.S. Pat. No. 5,855,735 discloses a method for decreasing sub-surface damage by a lapping process. This method comprises removing surface material by inducing micro-fractures in the surface using a rotating pad and an abrasive slurry, and chemically etching the surfaces of the wafer until all micro-fractures are removed therefrom.

Another method for reclaiming the wafer is a polishing process. In single-side polishing, a wafer surface is pressed onto a rotating pad, while a polishing solution containing abrasive grains is supplied between the pad and the wafer surface to remove the surface materials. In double-side polishing, a wafer is sandwiched between a pair of pads which rotate in opposite directions, while fine abrasive grains are supplied therebetween to remove small amount of material from surface. Thus, this method can significantly reduce subsurface damage compared to the above-mentioned lapping process.

The most frequently used polishing process is chemical-mechanical polishing using a polishing solution containing various chemicals. That is, the chemicals contribute to cleaving or weakening inter atomic bonds at the surface of a workpiece to be polished, while abrasive grains enhance wiping effects of the surface of the workpiece. Silicon wafers are usually subjected to single-side polishing using a polishing solution containing fine alkaline colloidal silica particles having diameters of 1 $\mu$m or less, in addition to potassium hydroxide, ammonium hydroxide and an organic amine. According to the Journal of The Society of Grinding Engineers, Vol. 40, No. 1, p. 19 (1996), a variety of abrasive grains, such as alumina, titania, zirconia, ceria, and silica, have been tested for polishing silicon wafers, and all of the abrasive grains other than silica cause oxidation induced stacking fault (OSF). Various opinions are proposed for the fact that alkaline colloidal silica is specifically suitable for polishing of silicon wafers. Although chemical-mechanical polishing, as a combination of mechanical polishing by fine silica particles and chemical etching by alkaline components, yields such specific polishing characteristics, details are still unknown. Polishing is performed to remove surface damage formed in the lapping step and to produce a mirror surface.

Chemical-mechanical polishing can also remove various films on the wafer surface. In recent production processes of semiconductor devices, multilayered configurations have been common. Since the multilayered configuration causes a difference in level of the film surface, the configuration will result in defocusing during the exposure step of the pattern of the device. Thus, the film surface of the multilayered configuration is generally planarized. Chemical-mechanical polishing is employed for planarization of the film surface to effectively remove particular film components so that the flatness of the film surface may be improved. Accordingly, chemical-mechanical polishing requires high selectivity for removal of the film components so that a specified component is more effectively removed than other components.

For example, the planarization of the aluminum wiring layer uses an acidic polishing solution containing aluminum oxide abrasive particles, hydrogen peroxide, and iron nitrate so that silicon oxide as a component of an dielectric layer is removed as little as possible. In contrast, the planarization of the dielectric layer composed of silicon oxide or the like uses an alkaline polishing solution containing silicon oxide (fumed silica) abrasive grains, potassium hydroxide (KOH), ammonium hydroxide ($NH_4OH$), and an organic amine so that the metallic wiring layer is removed as little as possible.

Such a chemical etching process can simply and uniformly reclaim the etching surface when the reclaimed wafer has a relatively small size, since the wafer has a relatively simplified film configuration. This chemical etching process, however, is not effective for uniform reclamation of a large wafer having a complicated surface film configuration and containing many components. Although many types of etching solutions must be prepared for effectively etching individual layers formed on a wafer, these etching solutions are not always useful for etching other wafers having different film components and configurations.

When each layer has a pattern, the etching rate of a portion of a specified layer is different from the etching rate of another portion of the layer. Thus, the bottom most layer inevitably has an irregular surface. For example, tungsten silicide (WSi) is a material which is barely removed by chemical etching.

A mixture of nitric acid ($HNO_3$) and hydrofluoric acid (HF) can remove most films and doped elements and is useful for removal of surface layers having complicated film configuration and composition. However, the silicon wafer substrate is also etched rapidly and unevenly. Since diffusion of the acid components controls reaction of the acid components with silicon, insufficient diffusion causes an uneven etching surface. Since acid is consumed before it diffuses, the acid diffused from the periphery of a large wafer is consumed before it reaches the center of the wafer. Thus, the center has an etching rate which is lower than that of the periphery. As a result, the center of the reclaimed wafer has a greater thickness compared to the thickness of the periphery, i.e. it has a crowned center.

Accordingly, the use of acid in reclamation of a used silicon wafer further facilitates unevenness of the surface after etching, since most components, including oxide films and nitride films, have etching rates which are lower than that of silicon.

When a used silicon wafer is immersed in an acid mixture, the periphery is first removed and then the center is removed. Since the silicon substrate is rapidly etched in this etching solution, the periphery of the reclaimed wafer is thinner than the center. A deviation in thickness due to such uneven etching rates reaches 20 to 40 $\mu$m for an 8-inch wafer, and thus the customer requirements for uniform thickness are not satisfied.

In the lapping process, use of a metal plate causes deep sub-surface damage on the wafer surface. If such deep sub-surface damage remains on the final reclaimed semiconductor wafer, it will result in deposition of dust or contamination, causing significant defects in the reclaimed wafer. Thus, the lapping process requires a subsequent chemical etching or polishing process to remove microcracks on the wafer surface and to ensure a smooth surface. Since the depth to be removed in this process depends on the deepest crack, the final decrease in the thickness is significantly large even if the decrease is minimized in the lapping process. As a result, the number of possible recycles per wafer is inevitably small. It is difficult to completely prevent formation of microcracks, even when a pad is used instead of the metallic surface plate. Accordingly, a technique is needed to minimize the decrease in thickness in the reclamation process as much as possible.

If the film on the silicon wafer can be removed by chemical-mechanical polishing, the polished wafer has a mirror surface which substantially corresponds to the surface after rough polishing of a virgin wafer. Thus, load on the subsequent steps can be significantly reduced, and the simplified steps will contribute to decreased production costs. Unlike in planarization in the semiconductor production steps, all types of films must be removed in the chemical-mechanical polishing. Furthermore, the silicon wafer itself must be polished to some extent in order to remove a degenerate zone beneath the surface of the wafer. Thus, the polishing solution must be effective for both the film and the wafer. In conventional polishing solutions, the size of the abrasive grains and selection of additives are selected so as to be effective for specified materials. The conventional polishing solutions are, therefore, unsuitable for effective polishing of certain films or materials. For example, alkaline colloidal silica for polishing a silicon wafer is not effective for polishing oxide and nitride films, as described above. Although cerium oxide can effectively polish a silicon oxide or nitride film, it is not suitable for polishing of the silicon wafer. Accordingly, there is no polishing solution suitable for a wide variety of components.

Under these circumstances, chemical-mechanical polishing is used only for finishing treatment of the surface after removal of the surface layer in the reclamation process.

THE INVENTION

Summary, Objects and Advantages

It is an object of the present invention to provide a method for reclaiming a wafer substrate, which is capable of minimizing a decrease in thickness of the wafer substrate in the reclamation process and increasing the number of times a wafer substrate may be recycled.

It is another object of the present invention to provide a polishing solution composition and film removal method capable of effectively polishing a silicon wafer having a wide variety of nonmetallic films, such as silicon, silicon oxide, and silicon nitride films, formed on the silicon wafer to form a mirror surface on the silicon wafer after removing the films.

In an aspect of the invention, a method is provided for reclaiming a wafer substrate including a chemical etching step for removing an entire metallic film and at least a part of a dielectric film on a wafer substrate material with a chemical etching agent so as not to substantially dissolve the wafer substrate material itself, a chemical-mechanical polishing step for removing the residual dielectric film and the degenerate zone beneath the surface of the substrate material, and then a finish polishing step for finish-polishing at least one surface of the substrate.

This process can minimize the decrease in total thickness of a used wafer to 20 $\mu$m or less, resulting in an increase in the number of times a used wafer substrate may be recycled.

Preferably, the chemical etching agent is at least one chemical etching agent selected from the group consisting of phosphoric, sulfuric, hydrofluoric, hydrofluoric-nitric, and hydrochloric-nitric chemical etching agents.

Preferably, the surface layer removal chemical-mechanical polishing step uses a polishing solution composition composed of at least one abrasive grain or sol material selected from the group consisting of aluminum oxide, zirconium oxide, cerium oxide, and silicon oxide. In addition, the polishing solution composition preferably has a pH of 8 to 12.

A grain is generally present in an aggregate of fundamental particles called primary particles, and the average size of the abrasive grains as aggregates is defined as the average particle size. Preferably, the abrasive grains contained in the polishing solution composition have an average primary particle size of about 30 to 2,000 nm. Preferably, the polishing solution composition contains about 1 to 30 percent by weight of abrasive grains or sols.

More preferably, the chemical-mechanical polishing step uses a polishing solution composition containing from about 2 to about 20 percent by weight of monoclinic zirconium oxide having a primary particle size of from about 30 to about 1,000 nm and a crystallite size of about 10 to 1,000 nm, and having a pH of 9 to 12.

Preferably, the zirconia polishing solution composition contains at least one alkaline component selected from the group consisting essentially of alkaline hydroxides, alkaline carbonates, ammonia, hydrazine, alkylammonium hydroxides, organic amines, and alkanolamines, in order to further improve polishing efficiency. Optionally, water-soluble alkaline silicate may be used with the zirconia polishing solution.

Alternatively, the chemical-mechanical polishing step may use a polishing solution composition containing from about 1 to about 20 percent by weight of cerium oxide having a primary particle size of from about 10 to about 2,000 nm, more preferably from about 10 to about 1,000 nm, and an average particle size of from about 30 to about 5,000 nm, containing a water-soluble alkaline silicate such as potassium silicate, and having a pH of 9 to 12.

Preferably, the cerium oxide polishing solution composition contains at least one alkaline component selected from the group consisting essentially of alkaline hydroxides, alkaline carbonates, ammonia, hydrazine, alkylammonium hydroxides, organic amines, and alkanolamines, in order to further improve polishing efficiency.

In the chemical-mechanical polishing step, the wafer substrate is preferably held between a pair of surface plates, each provided with a pad on a surface thereof, to simultaneously and effectively polish the two faces of the wafer substrate.

These compositions can minimize a decrease in total thickness of a used wafer to 20 $\mu$m or less in a reclaiming process, resulting in an increase in the number of times a used wafer substrate may be recycled.

DESCRIPTION OF THE PREFERRED EMBODIMENTS; INCLUDING THE BEST MODE OF CARRYING OUT THE INVENTION

As an preferred embodiment of the method in accordance with the present invention, a method for reclaiming a silicon semiconductor wafer will now be primarily described. The present invention, however, is not limited to this method, and is also applicable to reclamation of other wafers composed of, for example, gallium-arsenic, sapphire, gadolinium gallium garnet (GGG), and indium-phosphorus.

The following are outline steps for reclaiming the silicon semiconductor wafer:

A) A chemical etching step for removing all metallic films and at least parts of dielectric films of a wafer substrate material having a surface coating layer including the metallic films and the dielectric films with a chemical etching agent so as not to substantially dissolve the wafer substrate material itself;

B) a chemical-mechanical polishing step for removing the residual dielectric films and the degenerate zone beneath surface of the substrate material; and then C) a finish polishing step for finish-polishing at least one surface of the substrate. Herein, the term "so as not to substantially dissolve the wafer substrate material itself" means that, in the wafer substrate having a surface coating layer including metallic films and dielectric films, the metallic films and at least parts of the dielectric films are removed and thickness reduction of the wafer substrate is controlled to be about 1 $\mu$m or less.

Figure 1:
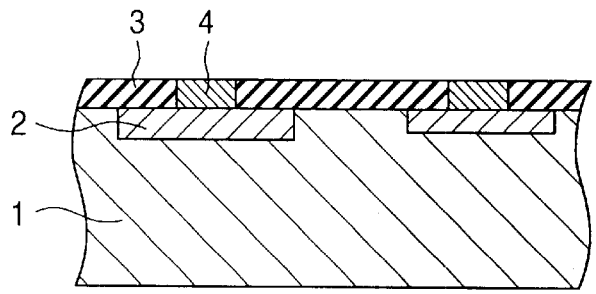
FIG. 1 is a partial cross-sectional view of a used wafer.
Figure 2:
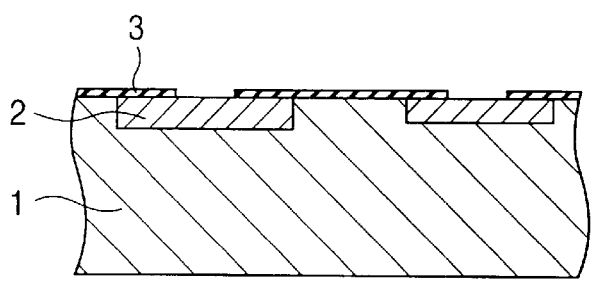
FIG. 2 is a partial cross-sectional view of a wafer in which the surface coating films are partially removed by etching in a reclaiming method in accordance with an embodiment of the present invention.

FIG. 1 is an enlarged partial cross-sectional view of a used wafer before reclamation, and FIG. 2 is an enlarged partial cross-sectional view of the wafer after the surface coating films are partly removed by etching.

A wafer substrate 1 has a front surface provided with a single layer or a plurality of layers including, for example, a doped zone 2, a dielectric layer 3, and a metallic wiring layer 4.

Examples of preferable etching agents used in the chemical etching include phosphoric, sulfuric, hydrofluoric, hydrofluoric-nitric, and hydrochloric-nitric chemical etching agents. These agents may be used alone. Alternatively, at least two agents may be used simultaneously in a mixture, or sequentially, if necessary. The phosphoric, sulfuric, hydrofluoric, and hydrochloric-nitric chemical etching agents do not dissolve silicon even when the concentration is high. Although a concentrated hydrofluoric-nitric chemical etching agent dissolves silicon, this agent can be used under conditions for dissolving the metallic films but not substantially dissolving the silicon (a decrease in thickness within a range of 1 $\mu$m) by diluting it with water (adjusting concentration), control of the etch time and or temperature.

For example, a concentrated hydrofluoric-nitric etching solution dissolves the silicon substrate. When a used wafer is immersed into a diluted solution having the composition of, for example, 69% nitric acid:49% hydrofluoric acid:water=1:1:5 at room temperature for 10 minutes, the solution can remove not only metallic wiring films, such as aluminum and tungsten, but also parts of dielectric films, such as silicon oxide and silicon nitride. Since the diluted solution has weakened etching potential, the dielectric films, such as hard nitride and oxide films, partially remain on the substrate surface. A typical hard nitride film is formed by a high-temperature chemical vapor deposition (CVD) process. Although the diluted solution also partly dissolves the wafer substrate itself which is exposed after the surface coating films are removed, the decrease in thickness is at most 1 $\mu$m or less after etching at room temperature for 10 minutes. Thus, this diluted etching solution does not cause significant deterioration of flatness of the substrate.

Another preferable etching solution is a mixed etching solution (1:1 by volume) of an aqueous 25% sodium peroxodisulfate solution and concentrated sulfuric acid (96%). A wafer substrate is immersed into the mixed solution heated to 100° C. for about 10 minutes and washed with water. The wafer substrate then is immersed into an etching solution (1:1) of 49% hydrofluoric acid and water for about 10 minutes. This process can substantially remove metallic films of aluminum, tungsten and the like and dielectric films composed of primarily silicon oxide. In the process using these etching solutions, the decrease in thickness of the silicon wafer substrate itself is approximately 0.05 $\mu$m.

The compositions of the etching solution are not limited to the above examples. Any etching solution selected from the group consisting essentially of phosphoric, sulfuric, hydrofluoric, hydrofluoric-nitric, and hydrochloric-nitric chemical etching agents may also be used in this invention, and etching conditions such as concentration(s), ratio, temperature and etching time can be selected, as long as the etching solution can dissolve metallic films and parts of dielectric films from a wafer substrate material having a surface coating layer including the metallic films and the dielectric films, and the decrease in the thickness of the wafer substrate is limited to 1 $\mu$m or less, preferably less than about 0.05 $\mu$m.

Figure 3:
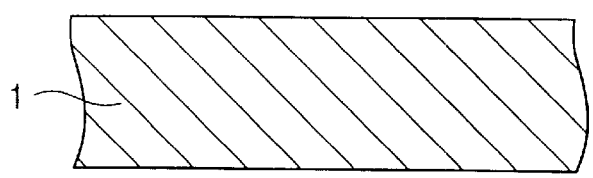
FIG. 3 is a partial cross-sectional view of a wafer in which the surface layers are removed by chemical-mechanical polishing (film removal polishing step) in a reclaiming method in accordance with an embodiment of the present invention.

Next, the etched wafer substrate (see FIG. 2) is subjected to chemical-mechanical polishing. FIG. 3 shows a wafer substrate after the chemical-mechanical polishing. In many cases, the coating films, which are formed on the front surface provided with semiconductor circuits of the wafer substrate, spread to the rear surface. Thus, it is preferable that the two surfaces of the wafer substrate be subjected to chemical-mechanical polishing.

Any commercially available single-side or double-side polishing machine may be used in the chemical-mechanical polishing process of this invention. When a single-side polishing machine is used, the wafer substrate is mounted on a ceramic plate or held by a vacuum chuck or a template, and is pressed against a rotating pad to be polished while a polishing solution is supplied. When a double-side polishing machine is used, the wafer substrate is held in a carrier and sandwiched between a pair of pads rotating in the opposite directions while supplying a polishing solution so that the two faces are simultaneously polished. The use of a double-side polishing machine is preferable, since polishing of the two surfaces of the wafer substrate is preferable, as described above. The pressure of the chemical-mechanical polishing is preferably about 80 to 500 gf/cm$^3$.

A preferable pad used in the chemical-mechanical polishing is polyurethane or unwoven fabric bonded with a resin having an ASTM Type D hardness of 20 to 70. The coating films, which are not removed during the etching step and must be removed in this process, include only dielectric films, such as oxide films and nitride films, and thus does not include metallic films. It is, therefore, preferable to use a polishing solution which can polish these dielectric layers and the wafer substrate material having a diffused layer at substantially the same polishing rate.

A preferable polishing solution contains abrasive grains or sols having an average primary particle size of about 30 to 2,000 nm, composed of a material selected from aluminum oxide, zirconium oxide, cerium oxide, and silicon oxide. In combined use of fine abrasive particles and pads, the surface layer of the wafer substrate can be effectively removed by a combination of the mechanical removing effects of the abrasive grains and removing effects of the chemicals on the coating films and the wafer substrate material, unlike mechanical removing effects alone by the above-described lapping. It is more preferable that abrasive grains or sols of zirconium oxide and/or combination of cerium oxide and water-soluble alkaline silicates be used, since these do not cause scratches on the polished surface and can more effectively remove not only the residual films but also the wafer substrate material. It is more preferable to use monoclinic zirconium oxide having a primary particle size of 30 to 1,000 nm and a crystallite size of about 10 to 1,000 nm, or cerium oxide having a primary particle size of about 10 to 2,000 nm and more preferably about 10 to 1,000 nm, and an average particle size of about 30 to 5,000 nm. These particles can remove not only the residual coating films, but also the wafer substrate, with high efficiency without forming scratches on the polished surface. Preferably, the pH of the polishing solution lies in a range of 9 to 12. In such a pH range, polishing can be effectively achieved without agglomeration of fine zirconium oxide particles. Use of a proper surfactant and a surface modifier will achieve a more stable dispersion of these grains.

When the polishing solution contains at least one alkaline component selected from the group consisting essentially of alkaline hydroxides, alkaline carbonates, water-soluble alkaline silicates, ammonia, hydrazine, alkylammonium hydroxides, organic amines, and alkanolamines, the solution can enhance the chemical removing effects. The abrasive grain content in the polishing solution is preferably about 1 to 30 percent by weight, and more preferably about 5 to 30 percent by weight in order to improve polishing efficiency.

Zirconium oxide shows reversible solid-phase transition between the monoclinic system at a lower temperature and the tetragonal system at a higher temperature at approximately 1,000° C. The phase transition temperature varies with the trace amounts of impurities. When the zirconium oxide contains several percent of calcium oxide, magnesium oxide, or rare earth oxide, the stable crystal structure is the tetragonal system and phase transition will not occur. The tetragonal zirconium oxide containing small amounts of impurities is called stabilized zirconia. In this invention, monoclinic zirconium oxide having a crystallite size of about 10 to 1,000 nm is suitable for chemical-mechanical polishing, as a result of investigation regarding the effects of the crystal system and crystallite size of zirconium oxide on polishing characteristics by the present inventors. The crystallite size is determined by a Sherrer method using an X-ray powder diffractometer. The primary particle size must be about 30 to 1,000 nm to form fine particles having a crystallite size of about 10 to 1,000 nm.

Fine zirconium oxide particles may be prepared by pulverizing and sorting natural baddeleyite, or synthesized by adjusting the pH of an aqueous zirconate solution containing zirconium oxychloride or zirconium oxynitrate and atomizing the solution in a high-temperature atmosphere. Alternatively, the pH of an aqueous zirconate solution is adjusted to form precipitate of zirconium hydroxide and the precipitate is calcined to form zirconium oxide, followed by pulverization and classification. When zirconium oxide is synthesized from an aqueous zirconate solution, the calcination temperature must be 1,000° C. or more and preferably 1,100° C. or more, to form particles having high crystallinity. A higher calcination temperature generally causes higher crystallinity and a larger crystallite size. The upper limit of the calcination temperature is 1900° C., the phase transition temperature to the trigonal system; however, the actual calcination temperature is lower than the upper limit in consideration of cost and operational conditions.

So-called "aqueous zirconia sol" is not suitable for the components in accordance with the present invention, due to its low crystallinity. The aqueous zirconia sol is generally formed by a conventional process for synthesizing aqueous metal oxide sol such as colloidal silica, in which an aqueous metal salt solution is dehydrated and polymerized at a desired pH and a desired temperature.

Cerium oxide abrasive grains are generally prepared by calcination, pulverization and classification of natural ore containing rare earth oxide, for example, monazite or bastnasite. Bastnasitic abrasive grains contain approximately 50 percent by weight of cerium oxide. Some types of synthetic abrasive grains contain 90 percent by weight or more of cerium oxide. Both bastnasitic and synthetic abrasive grains may be used in the present invention. Preferably, these abrasive grains have a primary particle size of about 10 to 2,000 nm preferably about 10 to 1,000, and an average particle size of about 30 to 5,000 nm.

The pressure during polishing is preferably about 80 to 500 gf/cm$^2$, and more preferably about 130 to 500 gf/cm$^2$, in order to improve polishing efficiency.

The wafer substrate subjected to this step has mirror surfaces, which the wafer substrate material itself are exposed and do not include coating films or diffused layers. Since the etching solution contains metal components, the surfaces of the etched wafer substrate are contaminated with the metal components. These surfaces, however, can be removed by chemical-mechanical polishing to expose the wafer substrate material on the surfaces. Thus, the resulting surfaces are not substantially contaminated by the metal components. Since mirror polishing of two surfaces is desired in a large wafer having a diameter of 300 mm or more, the rear surface of the wafer substrate subjected to this step can be used as the rear surface of the final reclaimed wafer without additional treatment.

When coating films remain at the peripheral edge of the etched wafer substrate, it is preferable that the peripheral edge is subjected to mechanical or chemical-mechanical polishing to remove the coating films. In a preferable polishing method, the peripheral edge of the rotating wafer substrate is pressed by a polyethylene abrasive tape having a surface on which abrasive grains of aluminum oxide or silicon carbide are fixed. In another preferable polishing method, the peripheral edge of the rotating wafer substrate is pressed by a polyurethane or unwoven fabric pad bonded with a resin while supplying a polishing solution. The polishing solution may contain about 2 to about 20 percent by weight of colloidal silica or monoclinic zirconium oxide having a primary particle size of about 30 to 1,000 nm, a crystallite size of 10 nm or more, and may have a pH of 9 to 12.

Alternatively, the polishing solution may contain about 1 to 20 percent by weight of cerium oxide having a primary particle size of about 2,000 nm or less and preferably about 1,000 nm or less and an average particle size of about 30 to 5,000 nm, preferably containing a silicate, with a pH in the range of 9 to 12.

The surface(s) of wafer substrates not having the surface layers is finish-polished so as to have a smooth surface comparable to a prime wafer by any suitable conventional polishing process.

A decrease in thickness in each step of a method for reclaiming a wafer substrate in this embodiment is shown in Table 1. A total decrease in thickness in all the steps can be suppressed to about 20 μm or less, which is significantly less than 40 μm in conventional etching and lapping processes.

TABLE 1

Figure 4:
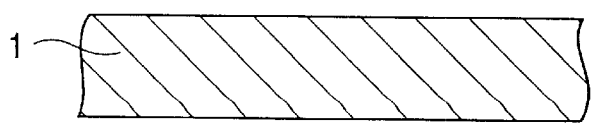
FIG. 4 is a partial cross-sectional view of a wafer in which the surface is polished (final polish step) in a reclaiming method in accordance with an embodiment of the present invention.

| Step | Decrease in thickness (μm) |
| --- | --- |
| Chemical Etching (FIG. 2) | 1 |
| Chemical-mechanical Polishing (FIG. 3) | 4 to 8 |
| Polishing (FIG. 4) | 5 to 11 |
| Overall Total | 11 to 20 |

The present invention will now be described in more detail with reference to the following Examples; however, the present invention is not limited to these Examples and may include modifications within the scope of the present invention.

EXAMPLE 1

A nitride or oxide surface layer shown in Table 2 was formed on the front surface of an 8-inch single crystal wafer substrate having a thickness of 725 μm and a {100} plane crystal orientation. Six substrates for each surface layer (twelve substrates in total) were prepared and used for reclamation treatment.

TABLE 2

| wafer group | Layer configuration |
| --- | --- |
| 1 | Nitride layer (thickness: 0.7 μm) |
| 2 | Patterned aluminum layer (thickness: 0.4 μm) on oxide layer (thickness: 0.5 μm) |

An etching solution of 69% nitric acid:49% hydrofluoric acid:pure water=1:1:5 (by volume) was poured into a Teflon bath, and then used wafers having the layer configurations shown in Table 2 were immersed therein and were subjected to etching at room temperature for 5 minutes. Most parts of the group 1 wafers became colored during the etching to greenish to reddish in response to the thickness of the nitride film which remained on the wafer. The center of the group 2 wafers became colored by the etching to yellowish to bluish due to the residual oxide film, although the aluminum layer was completely removed.

After this metal layer was removed by etching the following surface film removal and polishing steps were carried out:

a) Edge film removal step: Each wafer was fixed to a vacuum chuck with a rotating spindle and rotated at 450 rpm, and a polyurethane pad was pressed onto the wafer edge under a load of 500 g for one minute using an air cylinder, while supplying an aqueous edge polishing solution (the pH was adjusted to 10 using potassium silicate) containing a suspension of 5 percent by weight of cerium oxide abrasive grains having an primary particle size of 500 nm and an average particle size of 1800 nm at a rate of 40 ml/min.

b) Surface film removal CMP step: A pair of stainless steel plates, each having a diameter of 1,030 mm and provided with a polyurethane pad having an ASTM Type D hardness of 45°, were mounted onto a double-side polishing machine. Each wafer was held in a carrier inserted between two pads, and then surface film removal polished under a polishing pressure of 150 gf/cm$^2$ for 5 minutes while supplying an aqueous surface film removal polishing solution (the pH was adjusted to 10 using potassium silicate) containing 5 percent by weight of suspended cerium oxide abrasive grains having an average primary particle size of 500 nm and an average particle size of 1,800 nm at a rate of 400 ml/min. The surface film removal CMP step of this invention removes not only the surface film, but also the surface layer of the wafer containing diffused layer, IC component, etc.)

c) Optional conventional stock removal polish: The polished wafer was subjected to ultrasonic cleaning in pure water to remove adhered abrasive grains, and then the front surface was stock polished using a single-side polishing machine, as follows. A polyurethane pad was bonded to a stainless steel plate having a diameter of 812 mm, and the wafer mounted on a ceramic plate with wax was pressed to the pad face under a load of 200 gf/cm$^2$ and polished at a rotation of the surface plate of 60 rpm for 10 minutes while supplying a polishing solution (pH=10.5) containing 2.5 percent by weight of colloidal silica having an average particle size of 60 nm.

d) Conventional final polish step: Next, the wafer mounted on the ceramic plate was pressed against a plate with a soft polyurethane pad under a load of 100 gf/cm$^2$ and final polished at a rotation of the plate of 60 rpm for 10 minutes while supplying a final polishing solution (pH=10.5) containing 1 percent by weight of colloidal silica (average particle size: 35 nm). The polished wafer was subjected to standard RCA cleaning. The thickness was measured using an electrostatic non-contact thicknessmeter and the impurities on the polished surface were measured by total X-ray reflection fluorescence analysis.

The thicknesses of all the wafers were within a range of 710 to 712 μm and the number of each impurity was 10×10$^{10}$ atoms/cm$^2$ or less for aluminum, chromium, copper, iron, nickel, and zirconium. The results confirmed that the surface was free from contamination.

EXAMPLE 2

A nitride or oxide surface layer shown in Table 2 was formed on the front surface of an 8-inch single crystal wafer substrate having a thickness of 725 μm and a {100} plane crystal orientation. Six substrates for each surface layer (twelve substrates in total) were prepared and used for reclamation treatment. An etching solution composed of an aqueous 25% sodium peroxodisulfate solution:concentrated sulfuric acid (96%)=1:1 (by volume) was poured into a quartz bath, and then used wafers having the layer configurations shown in Table 2 were immersed therein and were subjected to etching at 100° C. for 10 minutes. Next, the wafers were immersed into a Teflon bath containing an etching solution of 49% hydrofluoric acid:water=1:2 (by volume) at room temperature for 10 minutes.

The group 1 wafers changed color during the etching, but films remained on the entire surface. In the group 1 wafers, a yellowish to bluish part due to the residual oxide film remained in the center, although the aluminum layer was completely removed.

a) Edge film removal step: Each wafer was fixed to a vacuum chuck with a rotating spindle and rotated at 450 rpm, and an abrasive tape with bonded SiC abrasive grains having an average particle size of 6 μm and then an abrasive tape with bonded abrasive grains having an average particle size of 2 μm were pressed onto the wafer edge under a load of 500 g for one minute each using an air cylinder.

b) Surface film removal: A pair of stainless steel plates, each having a diameter of 1,030 mm and provided with a polyurethane pad having an ASTM Type D hardness of 45°, were mounted onto a double-side polishing machine. Each wafer was held in a carrier inserted between two pads, and then surface film removal polished under a polishing pressure of 150 gf/cm$^2$ for 5 minutes while supplying an aqueous surface film removal polishing solution (the pH was adjusted to 10 using ethanolamine) containing 10 percent by weight of monoclinic zirconium oxide ($ZrO_2$) abrasive grains having an average particle size of 200 nm, which was determined by a dynamic light scattering method, and an average crystallite size of 15 nm at a rate of 400 ml/min.

c) Stock polishing: The polished wafer was subjected to ultrasonic cleaning in pure water to remove adhered abrasive grains, and then the front surface was stock polished, using a single-side polishing machine, as follows. A polyurethane pad was bonded to a stainless steel surface plate having a diameter of 812 mm, and the wafer mounted on a ceramic plate with wax was pressed to the pad face under a load of 200 gf/cm$^2$ and polished at a rotation of the surface plate of 60 rpm for 10 minutes while supplying a stock polishing solution (pH=10.5) containing 2.5 percent by weight of colloidal silica having an average particle size of 60 nm.

d) Final polish: Next, the wafer mounted on the ceramic plate was pressed against a surface plate with a soft polyurethane pad under a load of 100 gf/cm$^2$, and final polished at a rotation of the surface plate of 60 rpm for 10 minutes while supplying a final polishing solution (pH=10.5) containing 1 percent by weight of colloidal silica (average particle size: 35 nm). The polished wafer was subjected to standard RCA cleaning. The thickness was measured using an electrostatic non-contact thicknessmeter and the impurity on the polished surface was measured by total X-ray reflection fluorescence analysis.

The thicknesses of all the wafers were within a range of 710 to 712 μm and the amount of each impurity was 10×10$^{10}$ atoms/cm$^2$ or less for aluminum, chromium, copper, iron, nickel, and zirconium. The results confirmed that the surface was free from contamination.

Comparative Example

A nitride or oxide surface layer shown in Table 2 was formed on the front surface of an 8-inch single crystal wafer substrate having a thickness of 725 μm and a {100} plane crystal orientation. Six substrates for each surface layer (twelve substrates in total) were prepared and used for reclamation treatment for a chemical etching process.

An etching solution of 69% nitric acid:49% hydrofluoric acid:pure water=3:1:1 (by volume) was poured into a Teflon bath, and then used wafers having the layer configurations shown in Table 2 were immersed therein and were subjected to etching at room temperature for 1 minute. After cleaning, the front surface was stock polished using a single-side polishing machine, as follows. A polyurethane pad was bonded to a stainless steel surface plate having a diameter of 812 mm, and the wafer mounted on a ceramic plate with wax was pressed against the pad surface under a load of 200 gf/cm$^2$ and polished at a rotation of the surface plate of 60 rpm while supplying a stock polishing solution (pH=10.5) containing 2.5 percent by weight of colloidal silica having an average particle size of 60 nm.

Next, the wafer mounted on the ceramic plate was pressed to a surface plate with a soft polyurethane pad under a load of 100 gf/cm², and final polished at a rotation of the surface plate of 60 rpm for 10 minutes while supplying a final polishing solution (pH=10.5) containing 1 percent by weight of colloidal silica (average particle size: 35 nm). The polished wafer was subjected to standard RCA cleaning. The thickness was measured using an electrostatic non-contact thicknessmeter and impurities on the polished surface were measured by total X-ray reflection fluorescence analysis.

Since the periphery of the group 1 wafers was thinned by the etching, a polishing removal of 15 μm was necessary to obtain the total thickness variation (TTV) of less than 7 μm. Since the group 2 wafers had a thinned periphery and unevenness due to patterns, a polishing removal of 21 μm was necessary.

The thicknesses of all the reclaimed wafers were within a range of 677 to 687 μm and thus decreased by 38 to 48 μm. The front surface had an impurity level of $10 \times 10^{10}$ atoms/cm² or less for aluminum, chromium, copper, iron, nickel, and zirconium, but the rear surface had a residual aluminum content of $20 \times 10^{11}$ atoms/cm². This level was unsatisfactory for a reclaimed wafer.

Accordingly, the wafers reclaimed by the method in accordance with the present invention had a significantly low level of metallic contamination and a significantly minimized decrease in thickness which is one-half to one-quarter the decrease by conventional methods. The reclaiming method in accordance with the present invention can therefore increase the number of times a used wafer can be recycled.

When a semiconductor wafer is reclaimed, the method in accordance with the present invention can minimize a decrease in thickness to 20 μm or less, resulting in an increase in reclamation cycles. Since the surface layer of the wafer substrate is removed by chemical-mechanical polishing, metallic contamination can be significantly decreased not only on the front surface, but also on the rear surface. Thus, high quality of the reclaimed wafer can be maintained. As can be seen, by the inventive process it is possible to skip the stock polish step and proceed directly to final polish.

Where, in the foregoing description, reference has been made to specific components or integers of the invention having known equivalents then such equivalents are herein incorporated as if they were individually set forth.

Although this invention has been described by way of example and with reference to possible embodiments thereof, it is to be understood that modifications or improvements may be made thereto without departing from the scope of the invention as defined in the appended claims.

What is claimed is:

1. A method for reclaiming a wafer substrate, the method comprising:
   a) a chemical etching step removing an entire metallic film and at least a part of a dielectric film on a surface of a wafer substrate with a chemical etching agent so as not to substantially dissolve the wafer substrate material itself;
   b) a chemical-mechanical polishing step removing a residual dielectric film and a degenerate zone beneath the surface of the substrate; and
   c) a finish polishing step finish-polishing at least one surface of the substrate, wherein the chemical-mechanical polishing step directly follows the chemical etching step.

2. A method for reclaiming a wafer substrate according to claim 1, wherein the chemical etching agent is at least one chemical etching agent selected from the group consisting of phosphoric, sulfuric, hydrofluoric, hydrofluoric-nitric, and hydrochloric-nitric chemical etching agents.

3. A method for reclaiming a wafer substrate according to claim 1, wherein the chemical-mechanical polishing step uses a polishing composition containing 2 to 20 percent by weight of monoclinic zirconium oxide having a primary particle size of about 30 to 1,000 nm and a crystallize size of about 10 to 1,000 nm, and having a pH of 9 to 12.

4. A method for reclaiming a wafer substrate according to claim 3, wherein the polishing composition contains at least one alkaline component selected from the group consisting of alkaline hydroxides, alkaline carbonates, water-soluble alkaline silicates, ammonia, hydrazine, alkylammonium hydroxides, organic amines, and alkanolamines.

5. A method for reclaiming a wafer substrate according to claim 1, wherein the chemical-mechanical polishing step uses a polishing composition containing 1 to 20 percent by weight of cerium oxide having a primary particle size of about 10 to 2,000 nm and an average particle size of about 30 to 5,000 nm, containing water-soluble alkaline silicates, and having a pH of 9 to 12.

6. A method for reclaiming a wafer substrate according to claim 5, wherein the polishing composition contains at least one alkaline component selected from the group consisting of alkaline hydroxides, alkaline carbonates, ammonia, hydrazine, alkylammonium hydroxides, organic amines, and alkanolamines.

7. A method for reclaiming a wafer substrate according to claim 1, wherein the chemical-mechanical polishing step uses a polishing composition comprising at least one abrasive grain or sol material selected from the group consisting of aluminum oxide, zirconium oxide, cerium oxide, and silicon oxide.

8. A method for reclaiming a wafer substrate according to claim 7, wherein in the chemical-mechanical polishing step the wafer substrate is held between a pair of surface plates each provided with a pad on a surface thereof so that the two faces of the wafer substrate are simultaneously polished.

9. A method for reclaiming a wafer substrate according to claim 7, wherein the polishing composition has a pH of 8 to 12.

10. A method for reclaiming a wafer substrate according to claim 9, wherein the polishing composition contains at least one alkaline component selected from the group consisting of alkaline hydroxides, alkaline carbonates, water-soluble alkaline silicates, ammonia, hydrazine, alkylammonium hydroxides, organic amines, and alkanolamines.

11. A method for reclaiming a wafer substrate according to claim 7, wherein the abrasive grains contained in the polishing composition have an average primary particle size of about 30 nm to 2,000 nm.

12. A method for reclaiming a wafer substrate according to claim 11, wherein the polishing composition contains at least one alkaline component selected from the group consisting of alkaline hydroxides, alkaline carbonates, water-soluble alkaline silicates, ammonia, hydrazine, alkylammonium hydroxides, organic amines, and alkanolamines.

13. A method for reclaiming a wafer substrate according to claim 7, wherein the polishing composition contains about 1 to 30 percent by weight of abrasive grains or sols.

14. A method for reclaiming a wafer substrate according to claim 13, wherein the polishing composition contains at least one alkaline component selected from the group con sisting of alkaline hydroxides, alkaline carbonates, water-soluble alkaline silicates, ammonia, hydrazine, alkylammonium hydroxides, organic amines, and alkanolamines.

15. A method for reclaiming a wafer substrate, the method comprising:

a) a chemical etching step for removing an entire metallic film and at least a part of a dielectric film on a surface of a wafer substrate with a chemical etching agent so as not to substantially dissolve the wafer substrate material itself;

b) a chemical-mechanical polishing step for removing a residual dielectric film and a degenerate zone beneath the surface of the substrate; and c) a finish polishing step for finish-polishing at least one surface of the substrate, wherein the chemical-mechanical polishing step directly follows the chemical etching step.

* * * * *